United States Patent

Schröder et al.

[11] 4,278,945
[45] Jul. 14, 1981

[54] CIRCUIT FOR THE GENERATION OF A CONTROL VARIABLE FOR THE CONTROL OF THE TRANSFER CONSTANT OF ELECTRONICALLY ACTUABLE AMPLIFYING AND ATTENUATING MEMBERS

[75] Inventors: Ernst Schröder, Hanover; Jürgen Wermuth, Stederdorf, both of Fed. Rep. of Germany

[73] Assignee: Licentia Patent-Verwaltungs-G.m.b.H., Frankfurt am Main, Fed. Rep. of Germany

[21] Appl. No.: 80,949

[22] Filed: Oct. 1, 1979

[30] Foreign Application Priority Data

Oct. 2, 1978 [DE] Fed. Rep. of Germany ....... 2842945

[51] Int. Cl.³ .......................... H03G 3/00; H03H 7/24; H03B 1/64

[52] U.S. Cl. .................................. 330/278; 330/282; 333/14

[58] Field of Search .................... 333/14; 330/278, 282

[56] References Cited

U.S. PATENT DOCUMENTS

| | | | |
|---|---|---|---|
| 3,969,680 | 7/1976 | Wermuth | 330/282 |
| 3,986,049 | 10/1976 | Campbell et al. | 330/278 |
| 4,168,472 | 9/1979 | Sugimoto | 330/278 |

Primary Examiner—Alfred E. Smith
Assistant Examiner—T. N. Grigsby
Attorney, Agent, or Firm—Spencer & Kaye

[57] ABSTRACT

In a circuit for automatic dynamic compression or expansion the control voltage generator generates a control voltage which is linear against the logarithm of the input amplitude. This characteristic is achieved by a transfer member consisting of several transistors which are subject to different reference voltages and the series resistances of which are staggered.

5 Claims, 2 Drawing Figures

CIRCUIT FOR THE GENERATION OF A CONTROL VARIABLE FOR THE CONTROL OF THE TRANSFER CONSTANT OF ELECTRONICALLY ACTUABLE AMPLIFYING AND ATTENUATING MEMBERS

BACKGROUND OF THE INVENTION

The invention relates to a circuit for the generation of a control variable for the control of the transfer constant of electronically actuable amplifying or attenuating members.

In systems for the automatic dynamics compression and expansion it is essential to have an exactly reproducible relation between the transfer constant of the controllable amplifying and attenuating members and of the relevent useful signal input amplitude of the compressor or expander. This clear relationship between the said variables is an important prerequisite for the essential feature that the frequency spectrum and the level conditions of the reproduced useful signal correspond to those of the original. Beyond this there is another basic requirement for the expander input level to be absolutely identical to the compressor output level.

This second requirement is not always fulfillable without adjustment or compensation. It is for instance possible for level faults to occur in magnetic tape recording apparatus which are due to different types of tape or when the tapes are run off on several sets which have been differently adjusted.

The aforesaid second requirements can be dispensed with under the following conditions: level errors, also designated by the term "mistracking", do not exercise any influence on the level conditions of the useful signal when the characteristic curve for the compandor is "dB-linear" i.e. when it is linear (when plotted) against the logarithm of the input amplitude.

A transfer element with preferably exponentional characteristics is inserted between a charging capacitor in the control voltage generator and the control inputs of the electronically controllable amplifying or attenuating members for the achievement of the desired control characteristic (curve). This transfer element may consist of a diode or a transistor in which the exponential relationship between conducting state current and forward voltage of the semiconductor film is utilised. Only a few specific types of these exhibit good linearity over several decades.

SUMMARY OF THE INVENTION

The invention has the object of providing a transfer member depending upon a steady differentiable function, which works linear over several decades and in which it is possible to employ transistors which themselves do not exhibit the required linearity over several decades. This problem is solved by a transfer element determining the control characteristic comprises at least two transistors, the base of which are subjected to different reference voltages, and the emitter-collector current paths of which comprise different series resistances whereby one input of the transfer element is wired to a junction of the current paths which junction is adjacent to the emitters or collectors of the transistors, and one output is wired to a junction of the current paths which junction is adjacent to one of the collectors or emitters of the transistors.

BRIEF DESCRIPTION OF THE DRAWINGS

The invention will be explained in greater detail on an example of embodiment shown in the drawing.

DESCRIPTION OF THE PREFERRED EMBODIMENTS

Figure 1:
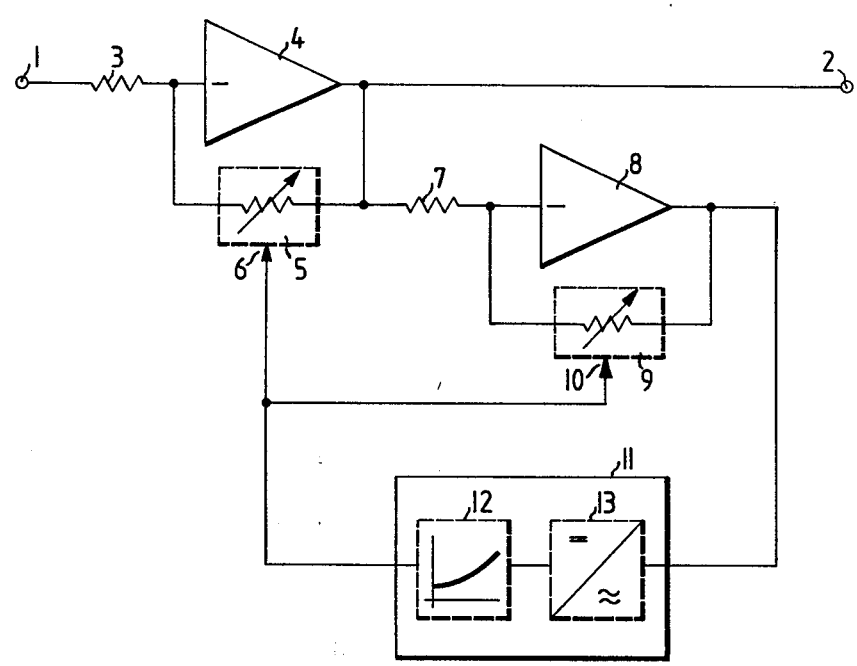
FIG. 1 shows a compression circuit such as has been previously disclosed e.g. in the U.S. Pat. No. 3,969,680.

The underlying principle of the prior art circuit will be explained with the aid of FIG. 1. The useful signals fed to the terminal 1 pass through a resistance 3 to the input of variable transfer constant amplifier 4 with an electronically actuable resistance 5. A compressed dynamics signal can be tapped from one output terminal 2. The level dependent control of the electronically controllable amplifier 4 is achieved by the feature that the signals occurring at its output are passed through a resistance 7 also to the input of another controllable amplifier 8 with an electrically controllable resistance 9. A threshold value rectifier 11 is arranged at the output of this amplifier. This rectifier 11 passes to the control inputs 6 and 10 of the electronically controllable resistance 5 and 9 appropriate control signals such that a signal with the dynamics 0 dB appears at the output of the electronically controllable amplifier 8. A transfer member 12 with exponential characteristic is wired internally to the load side of the control voltage generator 11 in parallel to the direct voltage generator 13 proper to achieve a dB-linear characteristic (according to drawing however: the control voltage generator comprises a direct voltage generator to the load side of which is connected a transfer member 12).

The design of this transfer member will now be described with the aid of FIG. 2.

Figure 2:
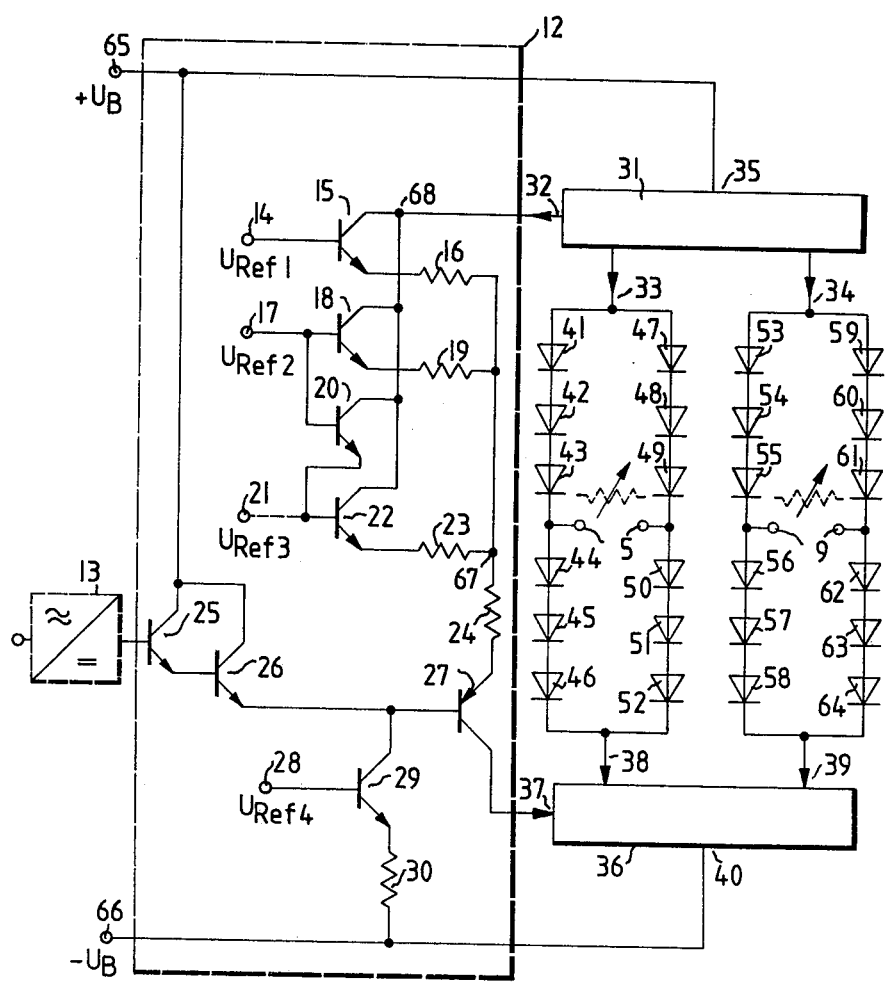
FIG. 2 shows the circuit in accordance with the invention which concerns a form of embodiment of the internal transfer element 12 shown in FIG. 1.

FIG. 2 is a cut-out of FIG. 1 and shows the internal direct voltage generator 13 to the load side of which is connected the transfer element 12, and the circuitry which yields the electronically controllable resistances 5 and 9.

The means which principally determine the control characteristic in the transfer member 12 are the transistors 15, 18 and 22 and the resistances 16, 19, 23 and 24. In this arrangement the collectors of the said transistors are interconnected and are connected also to an input 32 of a current mirror circuit 31. The emitter of the transistors 15, 18 and 22 are wired respectively to connections of the resistances 16, 19 and 23. The other connections of the resistances 16, 19 and 23 are connected with one another and are connected through a resistance 24 and the emitter-collector-section of a transistor 27 with an input 37 of a second current mirror circuit 36.

The bases of the transistors 15 and 18 are wired through input terminals 14 and 17 to reference voltages $U_{Ref1}$ and $U_{Ref2}$. The basis of the transistor 22 is analogically connected through an input terminal 21 to a reference voltage $U_{Ref3}$. Circuit engineering wise this reference voltage is generated through the connection of the base through the emitter-base-section of another transistor 20 with the reference voltage $U_{Ref2}$. The base of the transistor 27 is on its part wired to the collector of a transistor 29 the base of which is likewise wired through an input terminal 28 to a reference voltage $U_{Ref4}$ and the emitter of which is connected through a resistance 30 with an input terminal 66 into which is fed a negative operating voltage. The base of the transistor 27 is on the other hand wired to the emitter of a Darlington circuit comprising the transistors 26 and 25. The common collector of the Darlington circuit is wired to an input terminal 65 into which is fed a positive operating voltage. The base of the Darlington amplifier is wired to an internal direct voltage generator 13. The Darlington circuit comprising the transistors 25 and 26 is on its part employed on one hand for the matching of the potential of the internal direct voltage generator 13 and on the other hand to act as current amplifier. The triggering of the base of the transistor 25 achieves the control of the current distribution of the current supplied by the transistor 29 between the branch through the Darlington step comprising the transistors 25 and 26 and the branch comprising through the base-emitter-section of the transistor 27. It is in this way possible to effect with a control voltage applied to the base of a transistor 25 of the Darlington step the control of the potential at the emitter of the transistor 27. As a result of the exponential characteristic of the transistors 15, 18 and 22 there is achieved an exponential variation of their collector currents as a function of the potential at the emitter of the transistor 27. The magnitudes of the reference voltages $U_{Ref1}$, $U_{Ref2}$ and the magnitudes of the resistances 16, 19, 23 and 24 are all staggered in order to obtain the desired characteristic concerning the resulting collector currents of the transistors 15, 18 and 22 as a function of the potential at the emitter of the transistor 27. The reference voltage $U_{Ref1}$ is larger than the reference voltage $U_{Ref2}$. The resistance 16 is larger than the resistance 19, the resistance 19 is larger than the resistance 23 and the resistance 23 is larger than the resistance 24. The resistance 24 may also be dispensed with if its value is included in the rating and staggering of the resistances 16, 19 and 23. The characteristic will only be formed by the properties of the transistor 15 in conjunction with the resistances 16 and 24 as long as the potential at the common junction 67 of the resistances has a value between the reference voltage $U_{Ref1}$ and the reference voltage $U_{Ref2}$. An additional current is passed through the transistor 18 directly the potential at the common junction is between the reference voltage $U_{Ref2}$ and analogically between the reference voltage $U_{Ref3}$ so that the characteristic curve arising is obtained from the characteristics of the two transistors 15 and 18 in conjunction with the resistances 16 or 19 and 24. When the level at the common junction 67 of the resistances 16, 19, 23 and 24 becomes smaller than $U_{Ref3}$ the transistor 22 will open so that the resultant characteristic curve is then formed from the characteristics of all transistors 15, 18 and 22 in conjunction with the resistances 16, 19, 23 and 24. The staggering of the reference voltages and of the resistances is in this context designed so that another transistor is opened at the instant in which the range of the linearity of the other transistor it has left. It is in this way possible to achieve a characteristic curve pattern which has the required linearity over several decades. The resulting collector current from the transistors 15, 18 and 22 employed for triggering through the input 32 of the current mirror circuit 31 of diode chains which are wired in sets to one output 33 and one output 34 of the current mirror circuit 31. The current level circuit 31 brings about that the currents in each set of diodes correspond exactly to the input current into the current mirror circuit.

Each pair of diode chains comprises six series connected diodes 41 . . . 46, 47 . . . 52, 53 . . . 58 and 59 . . . 64. The other ends of the diode chains are in each case wired to the outputs 38 and 39 of a complementary current mirror circuit 36, into the input 37 of which is fed the collector current of the transistor 27 which is complementary to the transistors 15, 18 and 22. Between the junction points of the diodes 43,44 and 49,50 is formed a differential resistance as a function of the current through the diodes which resistance serves directly as electronically controllable resistance 5 in the circuit in accordance with FIG. 1. In the case of another set of the diode chains a differential resistance is formed at an appropriate place which in the circuit in accordance with FIG. 1 acts as electronically controllable resistance 9.

Since the current mirror circuits 31 and 36 are connected through terminals 35 and 40 to symmetrical supply voltages $+U_B$ and $-U_B$ and because there is a complementary circuit design the differential resistances 5 and 9 are at zero-potential.

What is claimed is:

1. A circuit for the generation of a control variable for the control of the transfer constant of electronically controllable amplifying or attenuating members in dependence upon a steady differentiable function, for an arrangement for the automatic dynamics-compression or -expansion comprising a rectifier having an input and an output the input of which is supplied by a signal which is provided for dynamics-compression or -expansion and a transfer element determining the control characteristic, having an input and an output, the input of which is coupled to the output of the rectifier and the output of which is coupled to the electronically controllable amplifying or attenuating members, the transfer element comprises at least two transistors, the bases of which are subjected to different reference voltages, and the emitter-collector current paths of which comprise different series resistances whereby one input terminal of the transfer element is wired to a junction of the current paths which junction is adjacent to the emitters of the transistors, and one output terminal is wired to a junction of the current paths which junction is adjacent to one of the collectors of the transistors.

2. A circuit as defined in claim 1, wherein the collectors of the transistors are interconnected and the series resistances are located between the emitters of the relevant transistors and a common junction, whereby the junction of the collectors forms the output and the junction of the resistors the input of the transfer element.

3. A circuit as defined in claim 2, wherein the input receives the input signal for the potential adaptation through one or several emitter-base sections of transistors.

4. A circuit as defined in claim 3, wherein in series to the current path of the transfer element there is wired the emitter-base-section of a least one further transistor for the formation of an identical magnitude current, the polarity of which is opposed to the current which can be tapped at the collector of the transfer element.

5. A circuit as defined in claim 4, wherein the complementary signal outputs are wired to the inputs of complementary current mirror circuits, the currents of which are employed for the symmetrical control of electronically controllable resistances designed in the form of diode chains.

* * * * *